(12) United States Patent
Happ et al.

(10) Patent No.: US 7,671,354 B2
(45) Date of Patent: Mar. 2, 2010

(54) INTEGRATED CIRCUIT INCLUDING SPACER DEFINED ELECTRODE

(75) Inventors: Thomas Happ, Tarrytown, NY (US); Jan Boris Philipp, Peekskill, NY (US); Ulrike Gruening-von Schwerin, Munich (DE)

(73) Assignee: Qimonda AG, Munich (DE)

( * ) Notice: Subject to any disclaimer, the term of this patent is extended or adjusted under 35 U.S.C. 154(b) by 196 days.

(21) Appl. No.: 11/760,913

(22) Filed: Jun. 11, 2007

(65) Prior Publication Data

US 2008/0303013 A1    Dec. 11, 2008

(51) Int. Cl.
*H01L 29/04* (2006.01)
(52) U.S. Cl. ......... 257/3; 257/4; 257/52; 257/E31.034; 65/148; 438/482; 438/900
(58) Field of Classification Search ........................ None
See application file for complete search history.

(56) References Cited

U.S. PATENT DOCUMENTS

| | | | |
|---|---|---|---|
| 6,593,176 B2 | 7/2003 | Dennison | |
| 6,597,007 B2 | 7/2003 | Wicker | |
| 6,969,633 B2 | 11/2005 | Dennison | |
| 7,135,696 B2 * | 11/2006 | Karpov et al. .................. | 257/2 |
| 2006/0092693 A1 | 5/2006 | Chen | |
| 2006/0097341 A1 | 5/2006 | Pellizzer et al. | |

OTHER PUBLICATIONS

"Novel uTrench Phase-change Memory Cell for Embedded and Stand-Alone Non-Volatile Memory Applications", F. Pellizzer, et al., Symposium on VLSI.Technology D gest of Technical Papers, 2004 (2 pgs.).*
"Highly Scalable On-axis Confined Cell Structure for High Density PRAM beyond 256Mb", S.C. Cho, et al., Symposium on VLSI Technology Digest of Technical Papers, 2005 (2 pgs.).
"OUM—A 180 nm Nonvolatile Memory Cell Element Technology for Stand Alone and Embedded Applications", Stefan Lai, et al., Intel Corporation (4 pgs.), 2001.
"Current Status of the Phase Change Memory and its Future", Stefan Lai, Intel Corporation IEEE, 2003 (4 pgs.).
"A Novel Cell Technology Using N-doped GeSbTe Films for Phase Change RAM", H. Horii, et al., Samsung Electronics Co., Ltd (2 pgs.), 2003.
"Full Integration and Reliability Evaluation of Phase-Change RAM Based on 0.24um-CMOS Technologies", Y.N. Hwang, et al., Symposium on VLSI Technology Digest of Technical Papers, 2003 (2 pgs.).
"A 90nm Phase Change Memory Technology for Stand-Alone Non-Volatile Memory Applications", F. Pellizzer, et al., Symposium on VLSI Technology Digest of Technical Papers, 2006 (2 pgs.).
"Novel uTrench Phase-Change Memory Cell for Embedded and Stand-Alone Non-Volatile Memory Applications", F. Pellizzer, et al., Symposium on VLSI_Technology Digest of Technical Papers, 2004 (2 pgs.).
"Switching Current Scaling and Reliability Evaulation in PRAM", Geong, et al., NVSMW 2004 ( pgs.).

* cited by examiner

*Primary Examiner*—Evan Pert
*Assistant Examiner*—Scott R Wilson
(74) *Attorney, Agent, or Firm*—Dicke, Billig & Czaja, PLLC

(57) ABSTRACT

An integrated circuit includes a contact, a first spacer, and a first electrode including a first portion and a second portion. The second portion contacts the contact and is defined by the first spacer. The integrated circuit includes a second electrode and resistivity changing material between the second electrode and the first portion of the first electrode.

27 Claims, 19 Drawing Sheets

INTEGRATED CIRCUIT INCLUDING SPACER DEFINED ELECTRODE

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

A typical phase change memory cell includes phase change material between two electrodes. The interface area between the phase change material and at least one of the electrodes determines the power used to program the memory cell. As the interface area between the phase change material and the at least one electrode is reduced, the current density through the phase change material is increased. The higher the current density through the phase change material, the lower the power used to program the phase change material.

For these and other reasons, there is a need for the present invention.

SUMMARY

One embodiment provides an integrated circuit. The integrated circuit includes a contact, a first spacer, and a first electrode including a first portion and a second portion. The second portion contacts the contact and is defined by the first spacer. The integrated circuit includes a second electrode and resistivity changing material between the second electrode and the first portion of the first electrode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to: be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
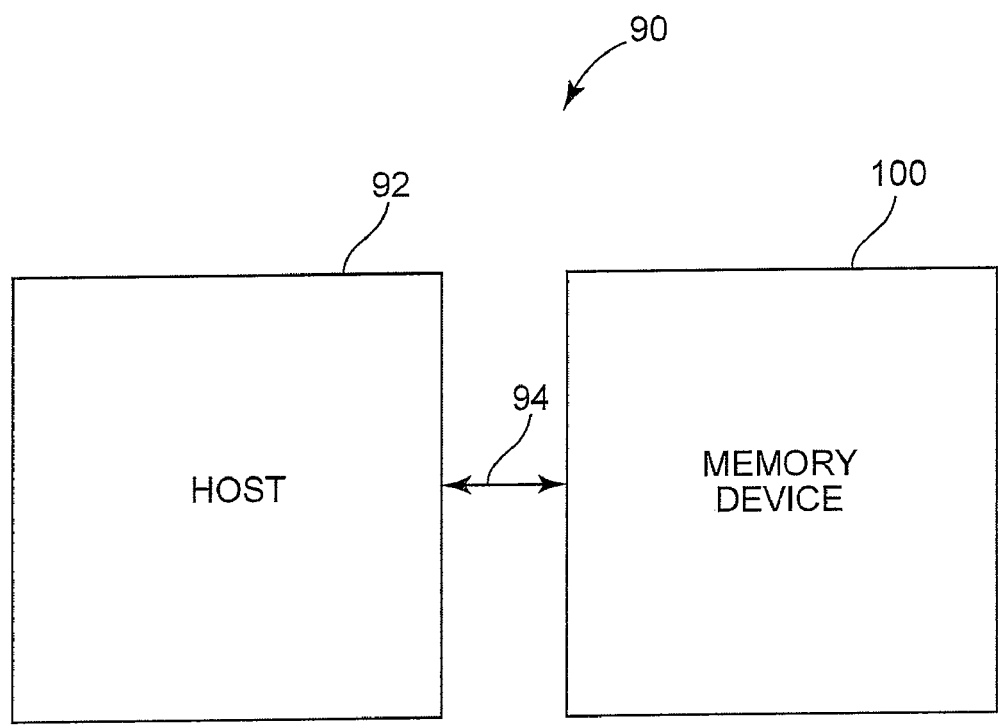
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2:
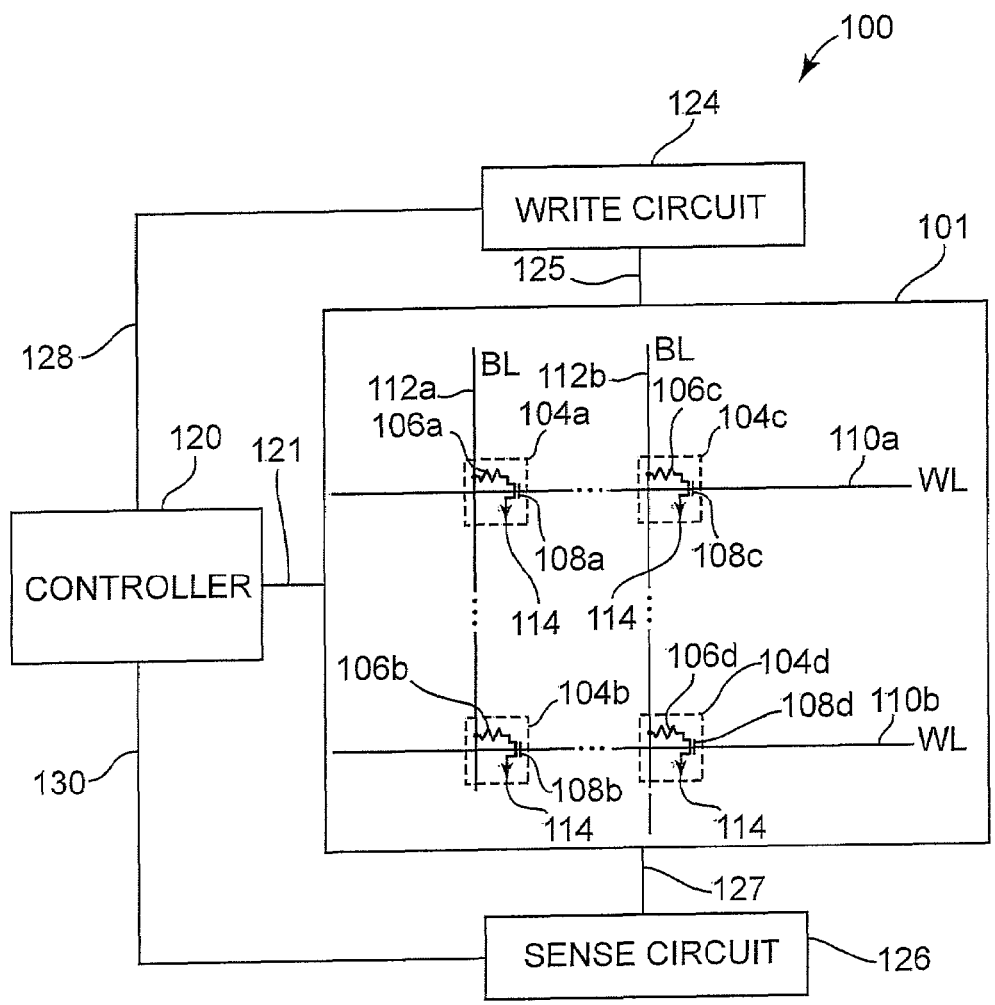
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110). In one embodiment, phase change memory cells 104a-104d are arranged in rows and columns.

Each phase change memory cell 104 includes an L-shaped sidewall defined bottom electrode. The bottom electrode avoids tight overlay tolerances. In addition, the bottom electrode is fabricated using a dielectric spacer to provide self-aligned isolation patterning in one direction, which reduces the number of critical lithography steps. The bottom electrode includes a sublithographic cross-section at the interface between the bottom electrode and the phase change material of each memory cell. The sublithographic cross-section at the interface reduces the current used to program each memory cell.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In one embodiment, sense circuit 126 provides voltage across one of the memory cells 104 and reads the current that flows through that one of the memory cells 104. In one embodiment, write circuit 124 provides voltage across one of the memory cells 104 and sense circuit 126 reads the current that flows through that one of the memory cells 104. In one embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using a similar current or voltage pulse.

Figure 3:
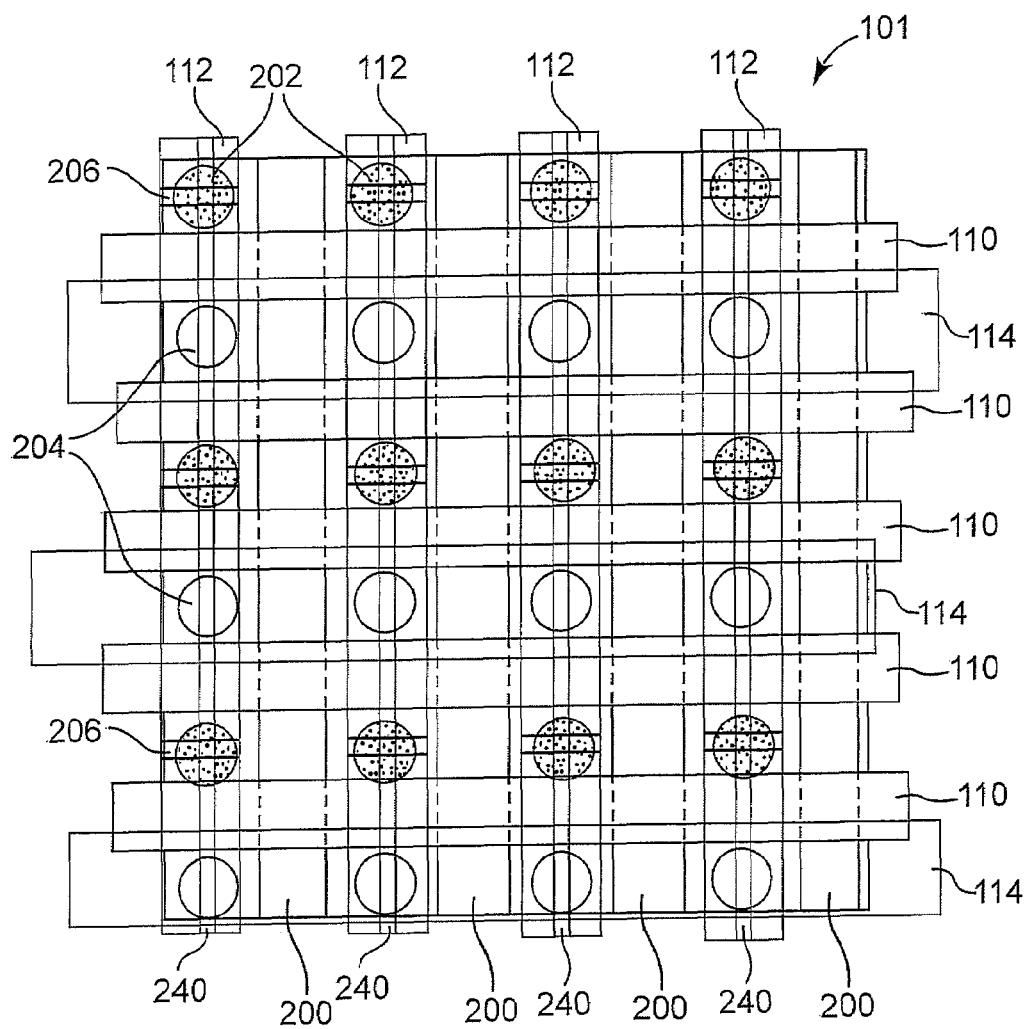
FIG. 3 illustrates a top view of one embodiment of a memory array.

FIG. 3 illustrates a top view of one embodiment of memory array 101. Memory array 101 includes bit lines 112, contacts 202, bottom electrodes 206, phase change material 240, ground lines 114, contacts 204, word lines 110, and shallow trench isolation (STI) 200. A phase change element 106 (FIG. 2) is provided in phase change material 240 at the interface between phase change material 240 and each bottom electrode 206. Each bottom electrode 206 includes a strip of electrode material perpendicular to a line of phase change material 240. Each phase change element 106 is electrically coupled to one side of the source-drain path of a transistor 108 (FIG. 2) through a bottom electrode 206 and a contact 202. The other side of the source-drain path of each transistor 108 is electrically coupled to a ground line 114 through a contact 204. The gate of each transistor 108 is electrically coupled to a word line 110. STI 200, or other suitable transistor isolation, is provided parallel to and between bit lines 112. Word lines 110 are perpendicular to bit lines 112 and parallel to ground lines 114. In one embodiment, bit lines 112 are above ground lines 114. In one embodiment, memory array 101 is an $8F^2$ dual gate array, where "F" is the minimum lithographic feature size. In other embodiments, memory array 101 is any suitable type and size memory array.

The following FIGS. 4-29B illustrate embodiments for fabricating a memory array, such as memory array 101 previously described and illustrated with reference to FIGS. 2 and 3.

Figure 4:
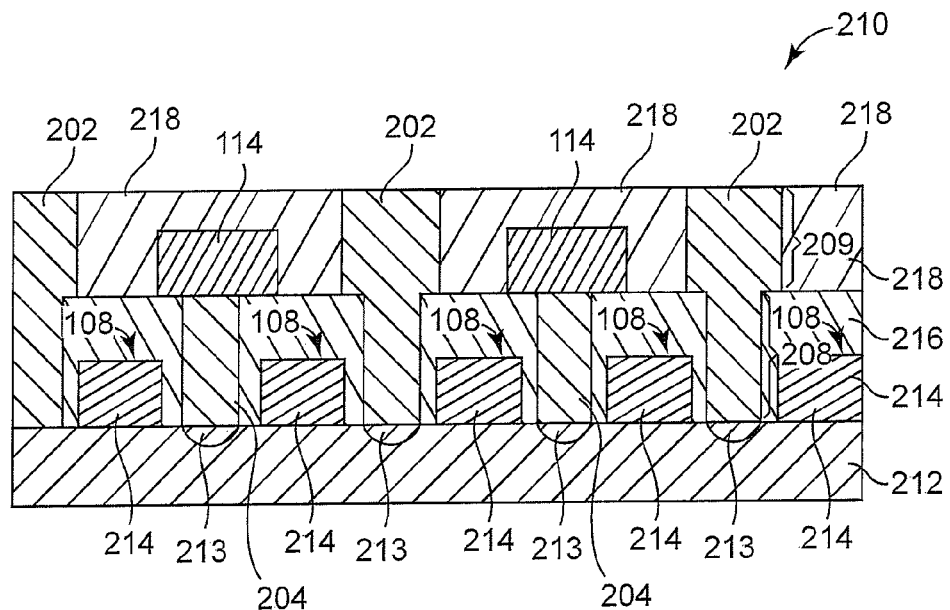
FIG. 4 illustrates a cross-sectional view of one embodiment of a preprocessed wafer.

FIG. 4 illustrates a cross-sectional view of one embodiment of a preprocessed wafer 210. Preprocessed wafer 210 includes a substrate 212, transistors 108 including source-drain regions 213 and gate contacts 214, contacts 204, ground lines 114, contacts 202, and dielectric material 216 and 218. Transistors 108 are formed in substrate 212. One source-drain region 213 of each transistor 108 is electrically coupled to a ground line 114 through a contact 204. The other source-drain region 213 of each transistor 108 is electrically coupled to a contact 202. The gate contact 214 of each transistor 108 is electrically coupled to a word line 110. Dielectric material 216 surrounds transistors 108, contacts 204, and first portions 208 of contacts 202. Dielectric material 218 surrounds ground lines 114 and second portions 209 of contacts 202.

Contacts 202 and 204 include TiN, TaN, W, Al, Ti, Ta, Cu, WN, C, or another suitable contact material. Ground lines 114 include W, Al, Cu, or another suitable material. Gate contacts 214 include doped poly-Si, W, TiN, NiSi, CoSi, TiSi, $WSi_x$, or another suitable material. Dielectric material 216 and 218 include $SiO_2$, $SiO_x$, SiN, fluorinated silica glass (FSG), boro-phosphorous silicate glass (BPSG), boro-silicate glass (BSG), or other suitable dielectric material.

Figure 5:
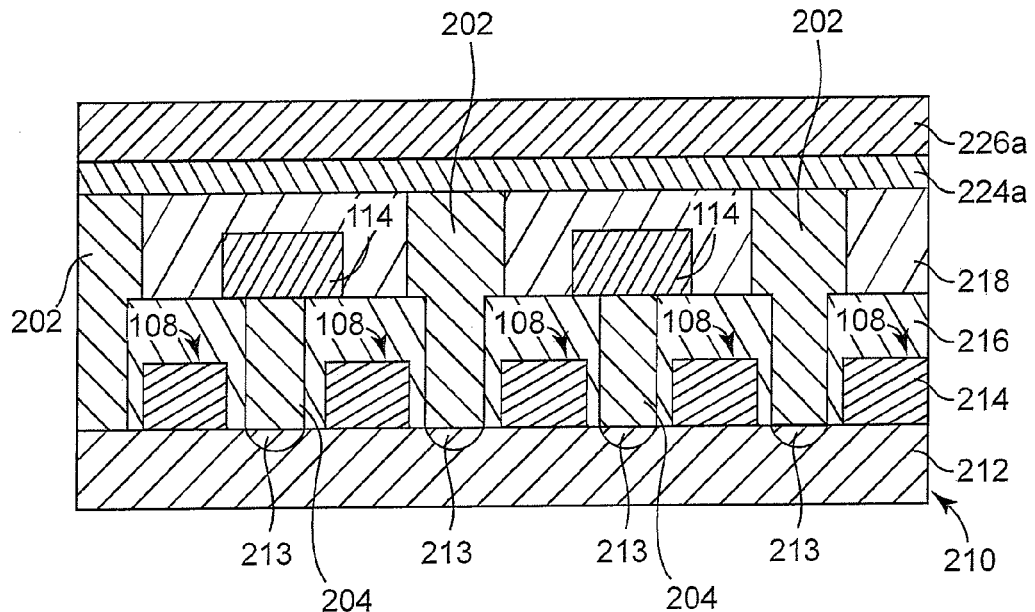
FIG. 5 illustrates a cross-sectional view of one embodiment of the preprocessed wafer, a first dielectric material layer, and a second dielectric material layer.

FIG. 5 illustrates a cross-sectional view of one embodiment of preprocessed wafer 210, a first dielectric material layer 224a, and a second dielectric material layer 226a. A first dielectric material, such as SiN or other suitable dielectric material is deposited over preprocessed wafer 210 to provide first dielectric material layer 224a. First dielectric material layer 224a is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

A second dielectric material different from the first dielectric material, such as $SiO_2$, $SiO_x$, SiN, FSG, BPSG, BSG, or other suitable dielectric material is deposited over first dielectric material layer 224a to provide second dielectric material layer 226a. Second dielectric material layer 226a is deposited using CVD, HDP-CVD, ALD, MOCVD, PVD, JVD, spin-on, or other suitable deposition technique.

Figure 6A:
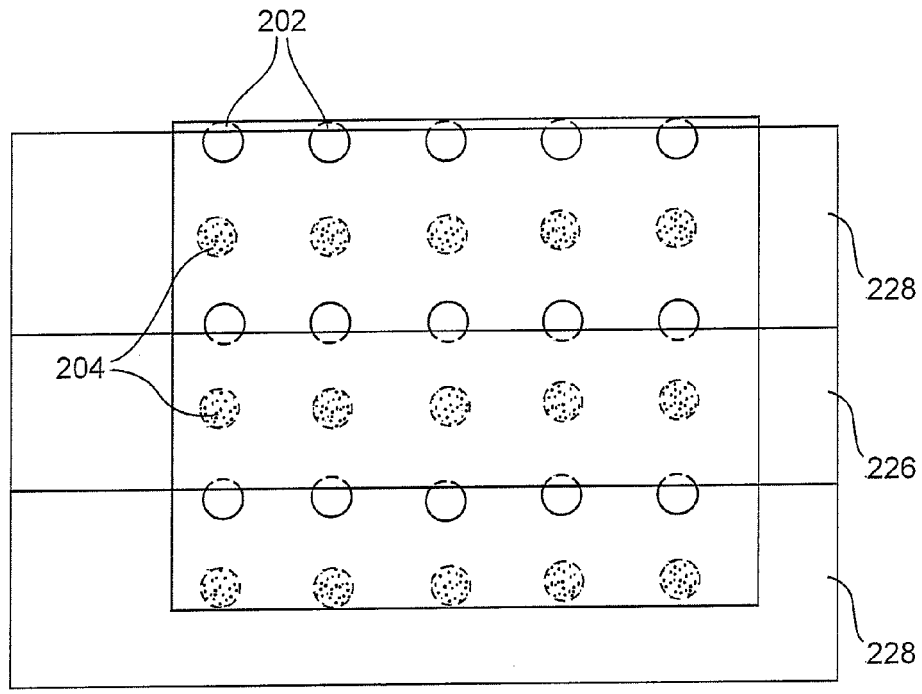
FIG. 6A illustrates a top view of one embodiment of the preprocessed wafer, the first dielectric material layer, and the second dielectric material layer after etching the first dielectric material layer and the second dielectric material layer.
Figure 6B:
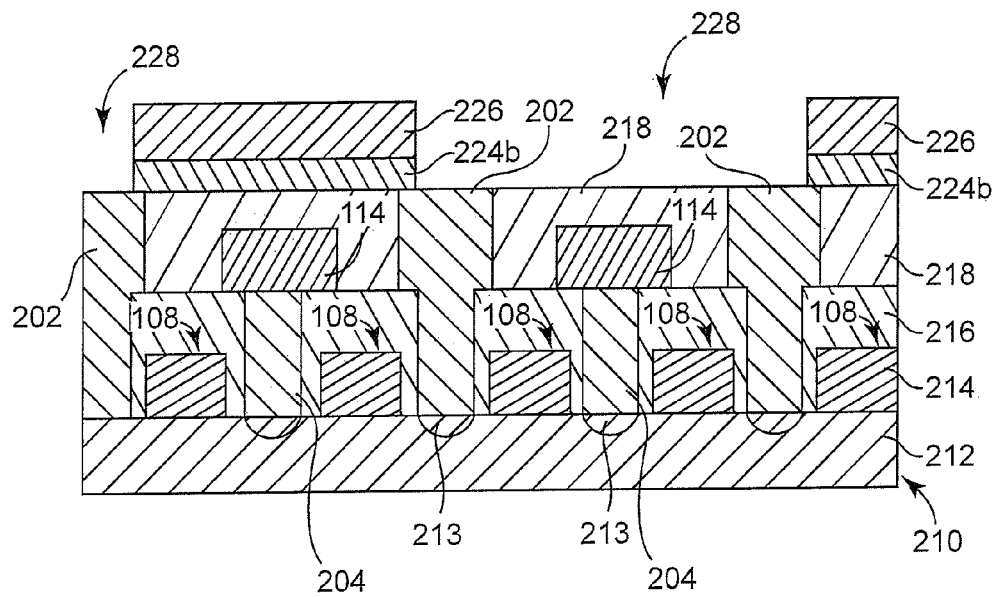
FIG. 6B illustrates a cross-sectional view of one embodiment of the preprocessed wafer, the first dielectric material layer, and the second dielectric material layer after etching the first dielectric material layer and the second dielectric material layer.

FIG. 6A illustrates a top view and FIG. 6B illustrates a cross-sectional view of one embodiment of preprocessed wafer 210, first dielectric material layer 224b, and second dielectric material layer 226 after etching first dielectric material layer 224a and second dielectric material layer 226a. Second dielectric material layer 226a and first dielectric material layer 224a are etched to provide openings 228 exposing portions of preprocessed wafer 210 including contacts 202 and to provide second dielectric material layer 226 and first dielectric material layer 224b. First dielectric material layer 224a and second dielectric material layer 226a are etched using a reactive-ion etch (RIE) or another suitable etching technique. In one embodiment, openings 228 are trenches.

Figure 7:
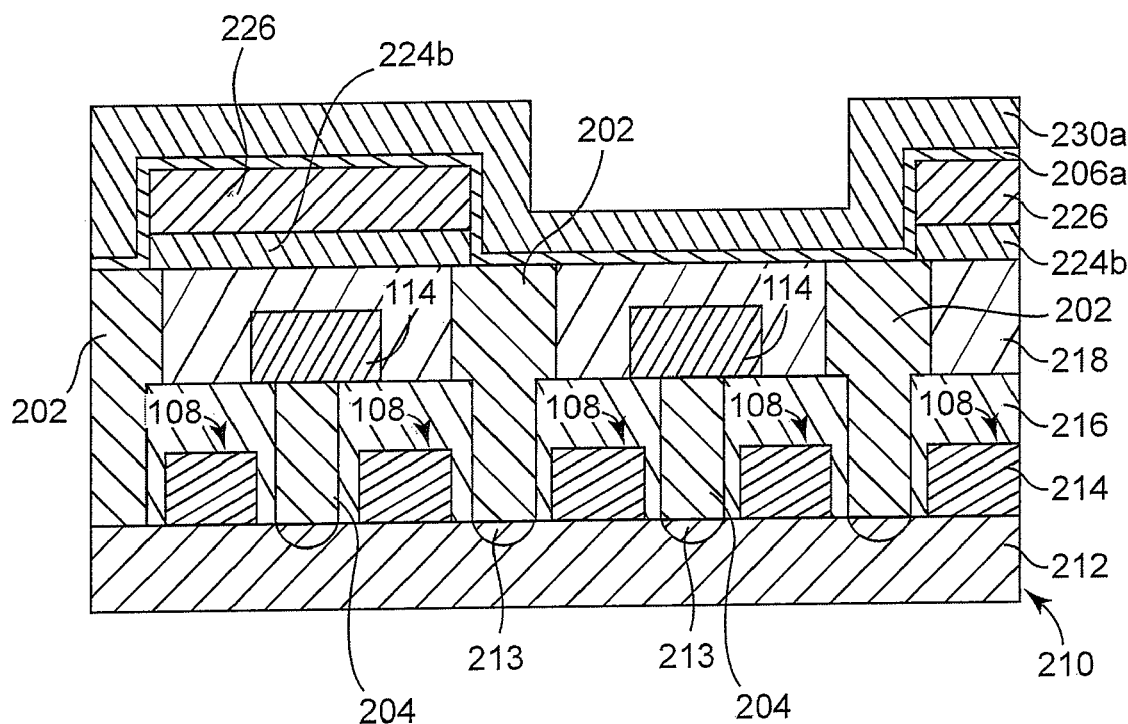
FIG. 7 illustrates a cross-sectional view of one embodiment of the preprocessed wafer, the first dielectric material layer, the second dielectric material layer, an electrode material layer, and a spacer material layer.

FIG. 7 illustrates a cross-sectional view of one embodiment of preprocessed wafer 210, first dielectric material layer 224b, second dielectric material layer 226, an electrode material layer 206a, and a spacer material layer 230a. An electrode material, such as TiN, TaN, W, Al, Ti, Ta, TiSiN, TaSiN, TiAlN, TaAlN, WN, C, or other suitable electrode material is conformally deposited over exposed portions of preprocessed wafer 210, first dielectric material layer 224b, and second dielectric material layer 226 to provide electrode material layer 206a. Electrode material layer 206a is deposited using CVD, ALD, MOCVD, PVD, JVD, or other suitable deposition technique.

A spacer material, such as SiN or another suitable spacer material is conformally deposited over electrode material layer 206a to provide spacer material layer 230a. Spacer material layer 230a is deposited using CVD, HDP-CVD, ALD, MOCVD, PVD, JVD, or other suitable deposition technique.

Figure 8A:
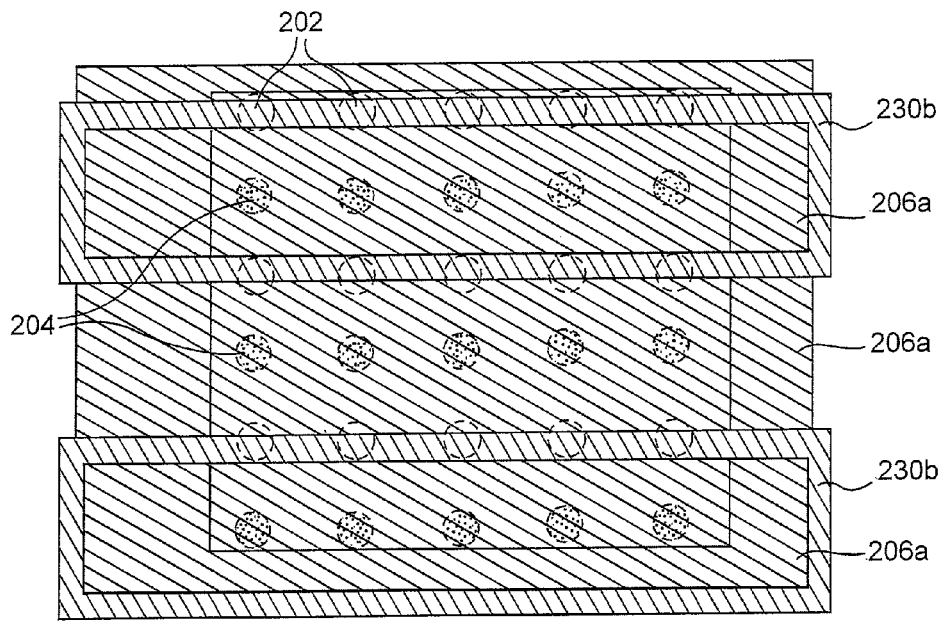
FIG. 8A illustrates a top view of one embodiment of the preprocessed wafer, the first dielectric material layer, the second dielectric material layer, the electrode material layer, and spacers after etching the spacer material layer.
Figure 8B:
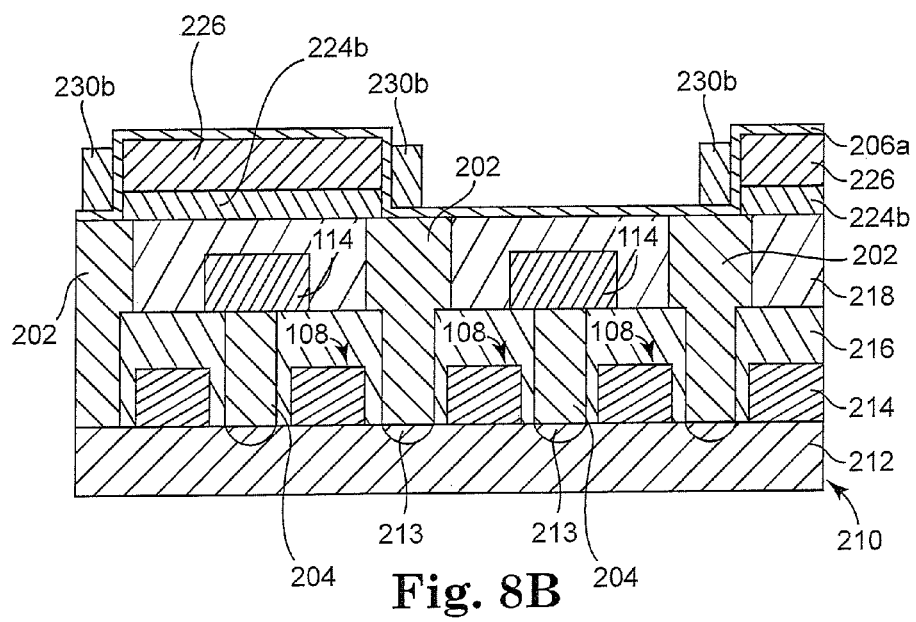
FIG. 8B illustrates a cross-sectional view of one embodiment of the preprocessed wafer, the first dielectric material layer, the second dielectric material layer, the electrode material layer, and spacers after etching the spacer material layer.

FIG. 8A illustrates a top view and FIG. 8B illustrates a cross-sectional view of one embodiment of preprocessed wafer 210, first dielectric material layer 224b, second dielectric material layer 226, electrode material layer 206a, and spacers 230b after etching spacer material layer 230a. Spacer material layer 230a is spacer etched using RIE or another suitable etching technique to expose portions of electrode material layer 206a and to provide spacers 230b.

Figure 9:
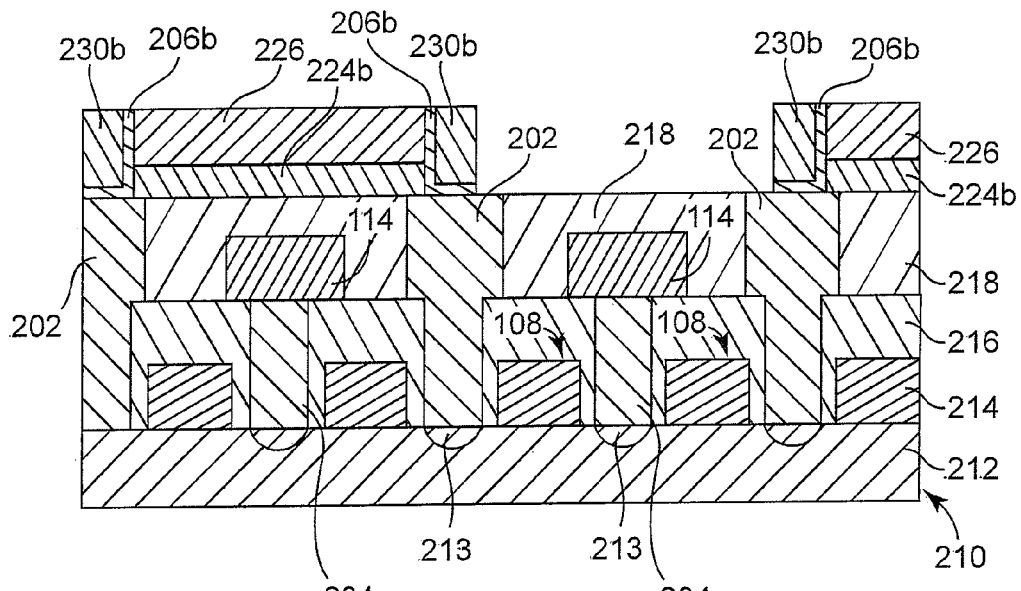
FIG. 9 illustrates a cross-sectional view of one embodiment of the preprocessed wafer, the first dielectric material layer, the second dielectric material layer, the electrode material layer, and spacers after etching the electrode material layer.

FIG. 9 illustrates a cross-sectional view of one embodiment of preprocessed wafer 210, first dielectric material layer 224b, second dielectric material layer 226, electrode material layer 206b, and spacers 230b after etching electrode material layer 206a. Electrode material layer 206a is etched self-aligned to spacers 230b using RIE or another suitable etching technique to expose second dielectric material layer 226 and portions of preprocessed wafer 210.

Figure 10:
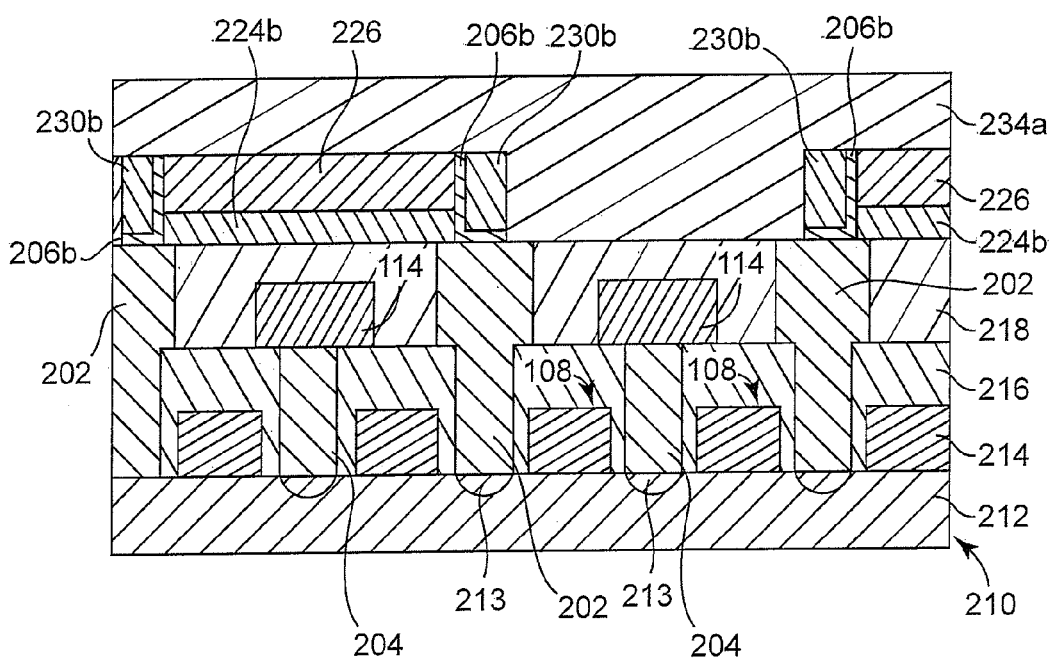
FIG. 10 illustrates a cross-sectional view of one embodiment of the preprocessed wafer, the first dielectric material layer, the second dielectric material layer, the electrode material layer, the spacers, and a third dielectric material layer.

FIG. 10 illustrates a cross-sectional view of one embodiment of preprocessed wafer 210, first dielectric material layer 224b, second dielectric material layer 226, electrode material layer 206b, spacers 230b, and a third dielectric material layer 234a. A dielectric material, such as $SiO_2$, $SiO_X$, SiN, FSG, BPSG, BSG, or other suitable dielectric material is deposited over exposed portions of second dielectric material layer 226, electrode material layer 206b, spacers 230b, and preprocessed wafer 210 to provide third dielectric material layer 234a. Third dielectric material layer 234a is deposited using CVD, HDP-CVD, ALD, MOCVD, PVD, JVD, or other suitable deposition technique.

Figure 11A:
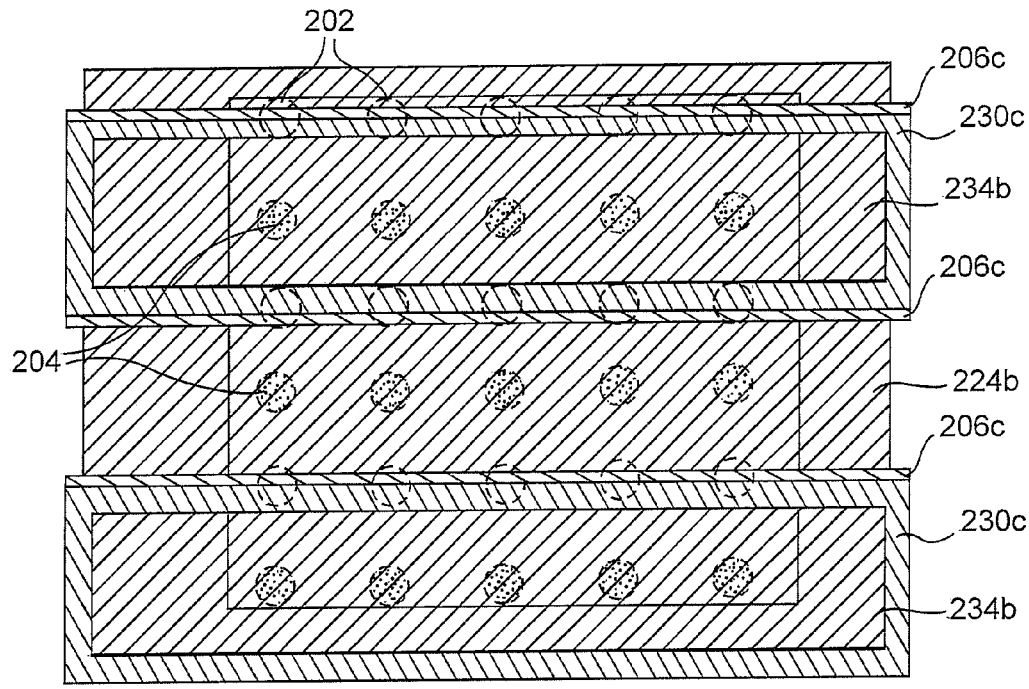
FIG. 11A illustrates a top view of one embodiment of the preprocessed wafer, the first dielectric material layer, the electrode material layer, the spacers, and the third dielectric material layer after planarization.
Figure 11B:
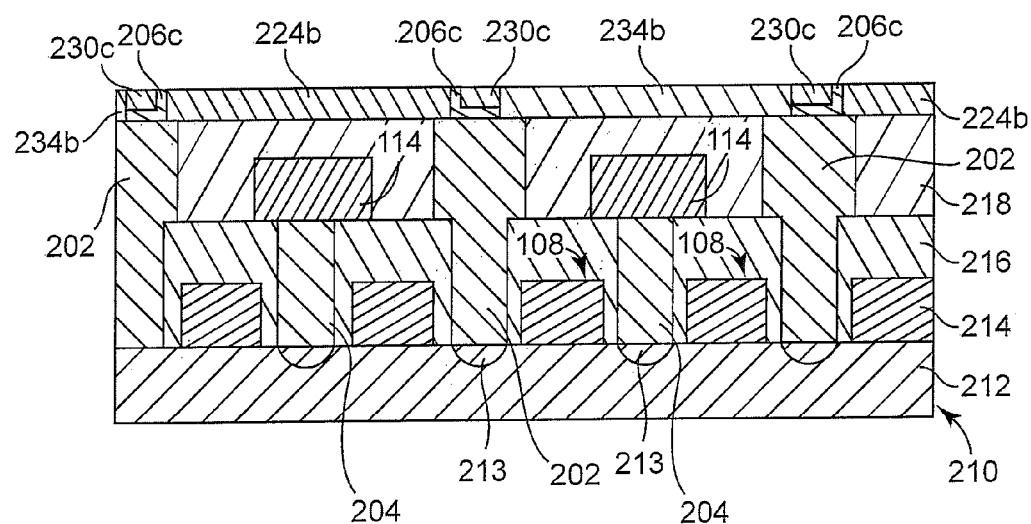
FIG. 11B illustrates a cross-sectional view of one embodiment of the preprocessed wafer, the first dielectric material layer, the electrode material layer, the spacers, and the third dielectric material layer after planarization.

FIG. 11A illustrates a top view and FIG. 11B illustrates a cross-sectional view of one embodiment of preprocessed wafer 210, first dielectric material layer 224b, electrode material layer 206c, spacers 230c, and third dielectric material layer 234b after planarization. Third dielectric material layer 234a, second dielectric material layer 226, electrode material layer 206b, and spacers 230b are planarized to remove second dielectric material layer 226 to expose first dielectric material layer 224b and to provide electrode material layer 206c and third dielectric material layer 234b. Third dielectric material layer 234a, second dielectric material layer 226, electrode material layer 206b, and spacers 230b are planarized using chemical mechanical planarization (CMP) or another suitable planarization technique.

Figure 12:
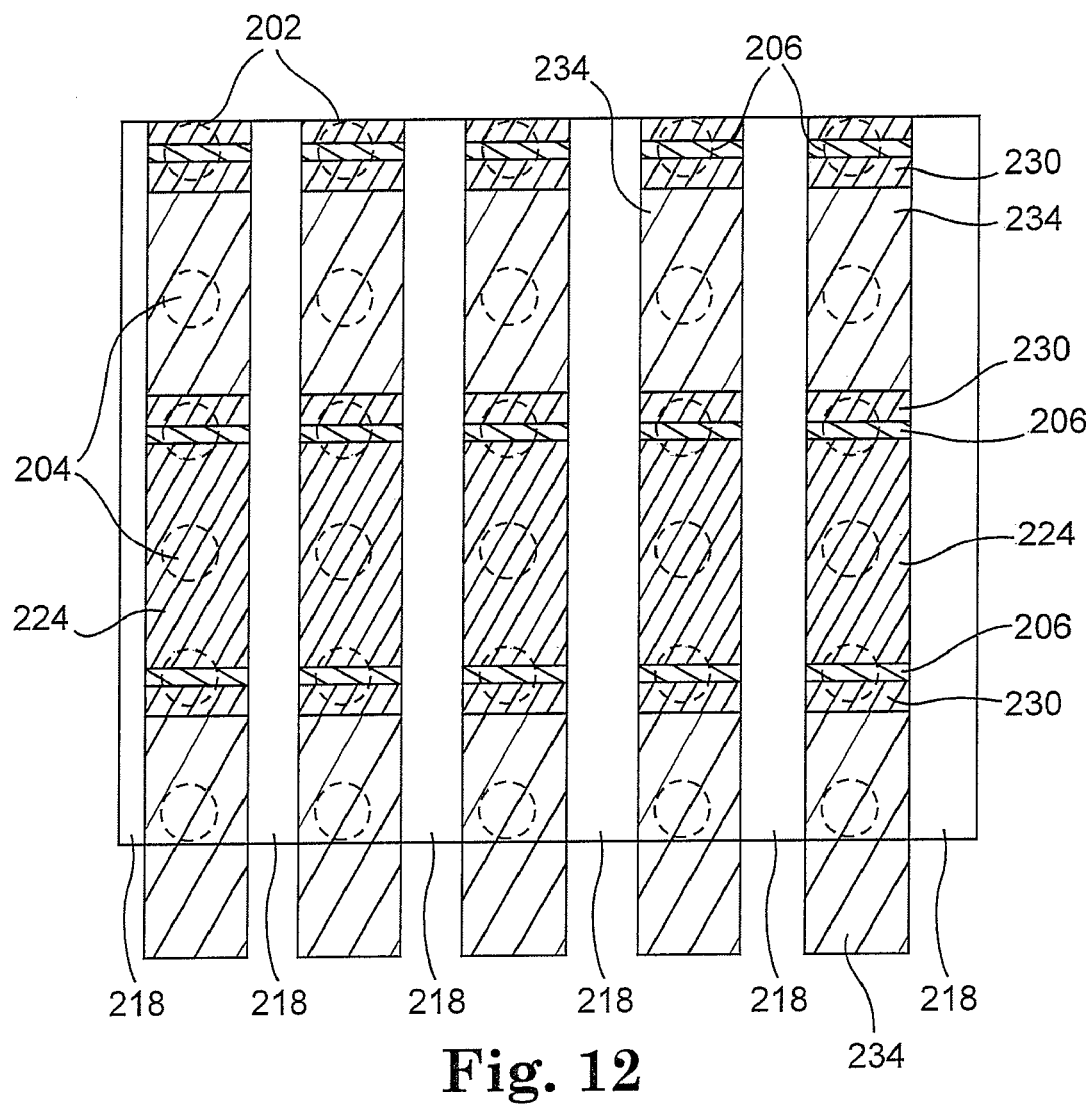
FIG. 12 illustrates a top view of one embodiment of the preprocessed wafer, the first dielectric material layer, bottom electrodes, the spacers, and the third dielectric material layer after etching the first dielectric material layer, the electrode material layer, the spacers, and the third dielectric material layer.

FIG. 12 illustrates a top view of one embodiment of preprocessed wafer 210, first dielectric material layer 224, bottom electrodes 206, spacers 230, and third dielectric material layer 234 after etching first dielectric material layer 224b, electrode material layer 206c, spacers 230c, and third dielectric material layer 234b. First dielectric material layer 224b, electrode material layer 206c, spacers 230c, and third dielectric material layer 234b are etched using RIE or another suitable etching technique to expose portions of preprocessed wafer 210 and to provide first dielectric material layer 224, bottom electrodes 206, spacers 230, and third dielectric material layer 234. Electrode material layer 206c is etched such that each electrode 206 contacts a contact 206.

Figure 13A:
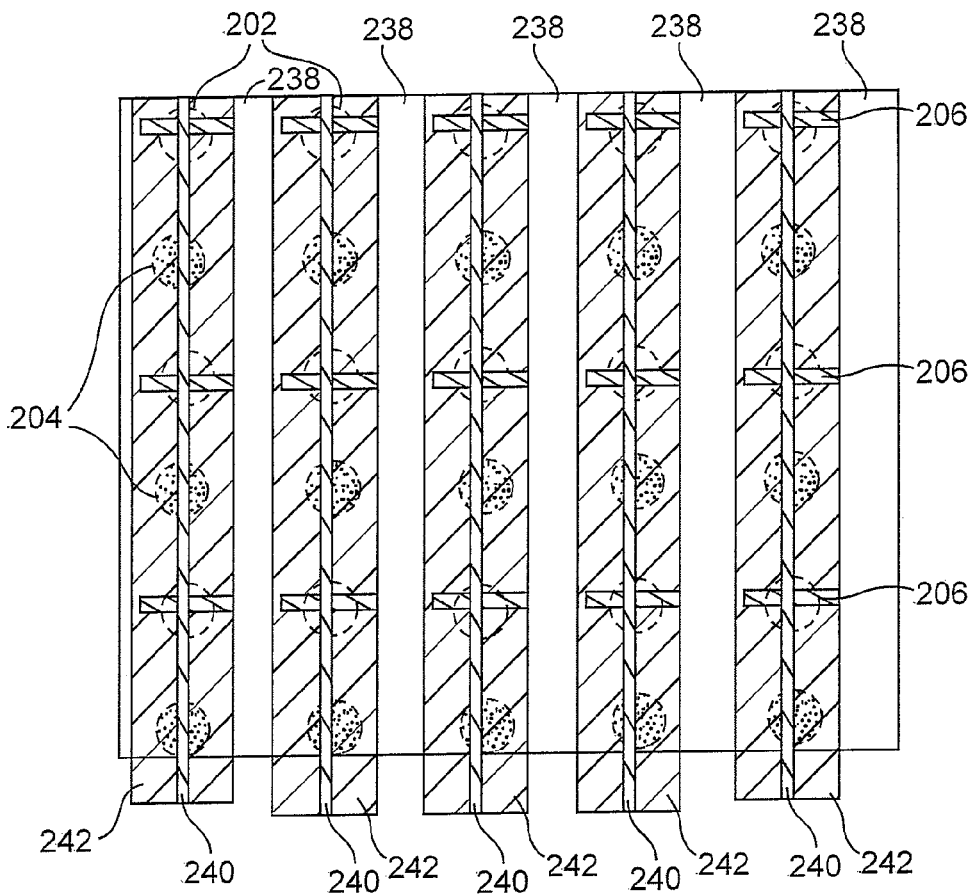
FIG. 13A illustrates a top view of one embodiment of the preprocessed wafer, the first dielectric material layer, the bottom electrodes, the spacers, the third dielectric material layer, a fourth dielectric material layer, phase change material, and top electrodes.
Figure 13B:
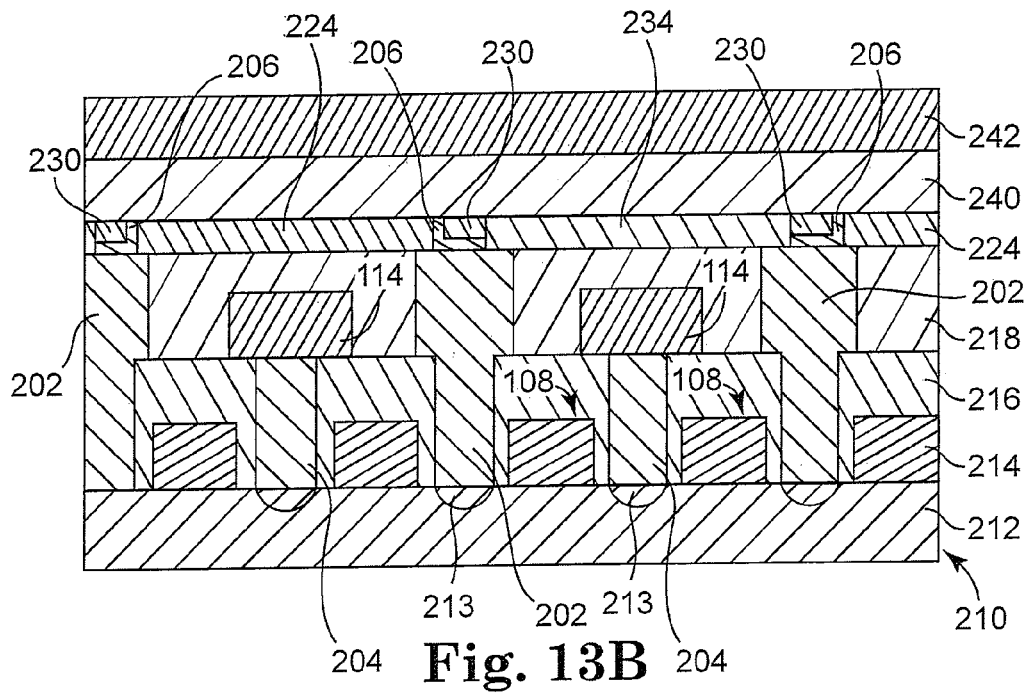
FIG. 13B illustrates a cross-sectional view of one embodiment of the preprocessed wafer, the first dielectric material layer, the bottom electrodes, the spacers, the third dielectric material layer, a fourth dielectric material layer, phase change material, and top electrodes.

FIG. 13A illustrates a top view and FIG. 13B illustrates a cross-sectional view of one embodiment of preprocessed wafer 210, first dielectric material layer 224, bottom electrodes 206, spacers 230, third dielectric material layer 234, a fourth dielectric material layer 238, phase change material 240, and top electrodes 242. A dielectric material, such as $SiO_2$, $SiO_X$, SiN, FSG, BPSG, BSG, or other suitable dielectric material is deposited over exposed portions of preprocessed wafer 210, first dielectric material layer 224, third dielectric material layer 234, bottom electrodes 206, and spacers 230 to provide a fourth dielectric material layer. The fourth dielectric material layer is deposited using CVD, HDP-CVD, ALD, MOCVD, PVD, JVD, or other suitable deposition technique. The fourth dielectric material layer is then planarized using CMP or another suitable planarization technique to expose first dielectric material layer 224, third dielectric material layer 234, bottom electrodes 206, and spacers 230 and to provide fourth dielectric material layer 238.

Optionally, an etch stop material, such as $Al_2O_3$, $SiO_2$, SiON, or other suitable etch stop material is deposited over fourth dielectric material layer 238, third dielectric material layer 234, bottom electrodes 206, and spacers 230 to provide an optional etch stop material layer (not shown). The etch stop material layer is deposited using CVD, HDP-CVD, ALD, MOCVD, PVD, JVD, or other suitable deposition technique.

A fifth dielectric material, such as SiN or another suitable dielectric material is deposited over the optional etch stop material layer or over fourth dielectric material layer 238, first dielectric material layer 224, third dielectric material layer 234, bottom electrodes 206, and spacers 230 to provide a fifth dielectric material layer. The fifth dielectric material layer is deposited using CVD, HDP-CVD, ALD, MOCVD, PVD, JVD, or other suitable deposition technique. The fifth dielectric material layer is etched to provide trenches exposing portions of bottom electrodes 206, spacers 230, first dielectric material layer 224, and third dielectric material layer 234. In one embodiment, the exposed portions of bottom electrodes 206 have sublithographic cross-sections.

A phase change material, such as a chalcogenide compound material or other suitable phase change material is deposited into the trenches and over exposed portions of the fifth dielectric material layer, bottom electrodes 206, first dielectric material layer 224, and third dielectric material layer 234 to provide a phase change material layer. The phase change material layer is deposited using CVD, HDP-CVD, ALD, MOCVD, PVD, JVD, or other suitable deposition technique. In another embodiment, a damascene process is used to provide the phase change material in the trenches.

An electrode material, such as TiN, TaN, W, Al, Ti, Ta, TiSiN, TaSiN, TiAlN, TaAlN, Cu, WN, C, or other suitable electrode material is deposited over the phase change material layer to provide an electrode material layer. The electrode material layer is deposited using CVD, HDP-CVD, ALD, MOCVD, PVD, JVD, or other suitable deposition technique. The electrode material layer and the phase change material layer are then etched using RIE or another suitable etching technique to expose fourth dielectric material layer 238 and to provide phase change material 240 and top electrodes 242. A phase change element is provided at the interface between each bottom electrode 206 and phase change material 240. In one embodiment, phase change material 240 and/or top electrodes 242 are etched such that each portion of phase change material after etching contacts one, two, three, or another suitable number of bottom electrodes 206.

Figure 14A:
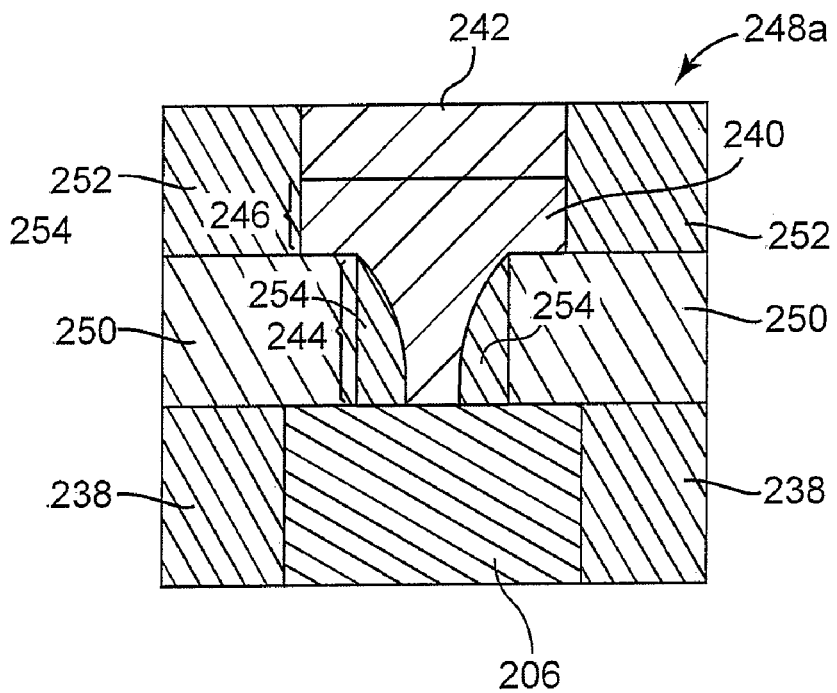
FIG. 14A illustrates a cross-sectional view of one embodiment of a phase change element.

FIG. 14A illustrates a cross-sectional view of one embodiment of a phase change element 248a. In one embodiment, each phase change element 106 is similar to phase change element 248a. Phase change element 248a includes a bottom electrode 206, phase change material 240, fourth dielectric material layer 238, fifth dielectric material layer 250, spacers 254, top electrode 242, and sixth dielectric material layer 252. The fabrication process of phase change element 248a begins by depositing the fifth dielectric material layer and etching the trenches to expose a portion of each bottom electrode 206 and to provide fifth dielectric material layer 250 as previously described with reference to FIGS. 13A and 13B.

Next, a spacer material, such as SiN or another suitable spacer material is conformally deposited over exposed portions of fifth dielectric material layer 250, bottom electrodes 206, spacers 230, first dielectric material layer 224, and fourth dielectric material layer 234 to provide a spacer material layer. The spacer material layer is deposited using CVD, HDP-CVD, ALD, MOCVD, PVD, JVD, or other suitable deposition technique. The spacer material layer is spacer etched using RIE or another suitable etching technique to expose fifth dielectric material layer 250 and to provide spacers 254. Spacers 254 reduce the cross-section of the exposed portion of each bottom electrode 206 to confine the current between bottom electrode 206 and top electrode 242.

The phase change material and electrode material is then deposited and etched as previously described and illustrated with reference to FIGS. 13A and 13B to provide phase change material 240 and top electrodes 242. Phase change material 240 includes first portions 254 in the trenches between spacers 254 and second portions 246 above the trenches. In one embodiment, second portions 246 of phase change material 240 have the same cross-sectional width as top electrodes 242.

Dielectric material, such as $SiO_2$, $SiO_x$, SiN, FSG, BPSG, BSG, or other suitable dielectric material is deposited over exposed portions of top electrodes 242, phase change material 240, and fifth dielectric material layer 250 to provide a sixth dielectric material layer. The sixth dielectric material layer is deposited using CVD, HDP-CVD, ALD, MOCVD, PVD, JVD, or other suitable deposition technique. The sixth dielectric material layer is then planarized using CMP or another suitable planarization technique to expose top electrodes 242 and to provide sixth dielectric material layer 252.

Figure 14B:
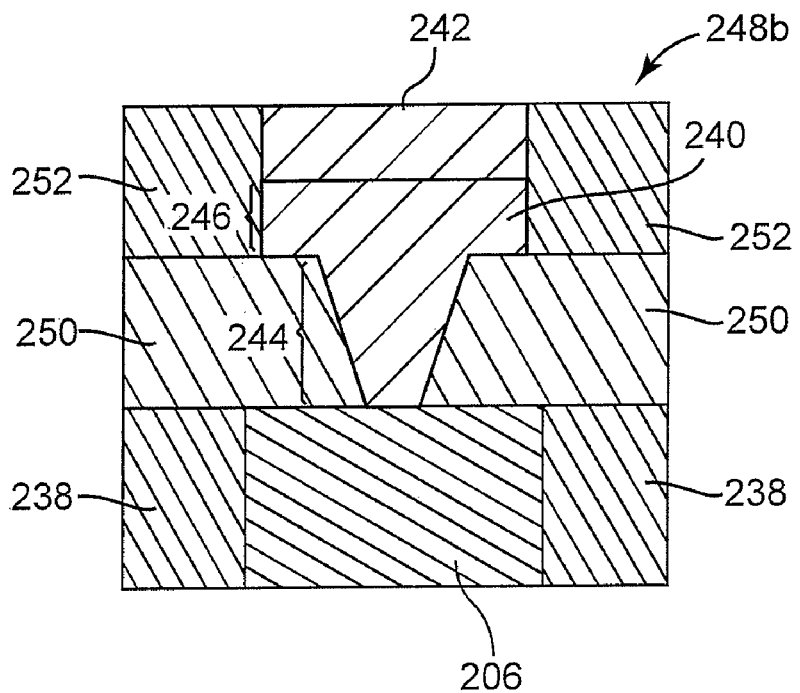
FIG. 14B illustrates a cross-sectional view of another embodiment of a phase change element.

FIG. 14B illustrates a cross-sectional view of another embodiment of a phase change element 248b. In one embodiment, each phase change element 106 is similar to phase change element 248b. Phase change element 248b includes a bottom electrode 206, phase change material 240, fourth dielectric material layer 238, fifth dielectric material layer 250, top electrode 242, and sixth dielectric material layer 252. The fabrication process of phase change element 248a begins by depositing the fifth dielectric material layer and etching the trenches to expose a portion of each bottom electrode 206 and to provide fifth dielectric material layer 250 as previously described with reference to FIGS. 13A and 13B. In this embodiment, however, the trenches are tapered as indicated by first portion 244 of phase change material 240 to confine the current between bottom electrode 206 and top electrode 242. The remaining fabrication steps are similar to the steps previously described and illustrated with reference to FIGS. 13A, 13B, and 14A.

Figure 15:
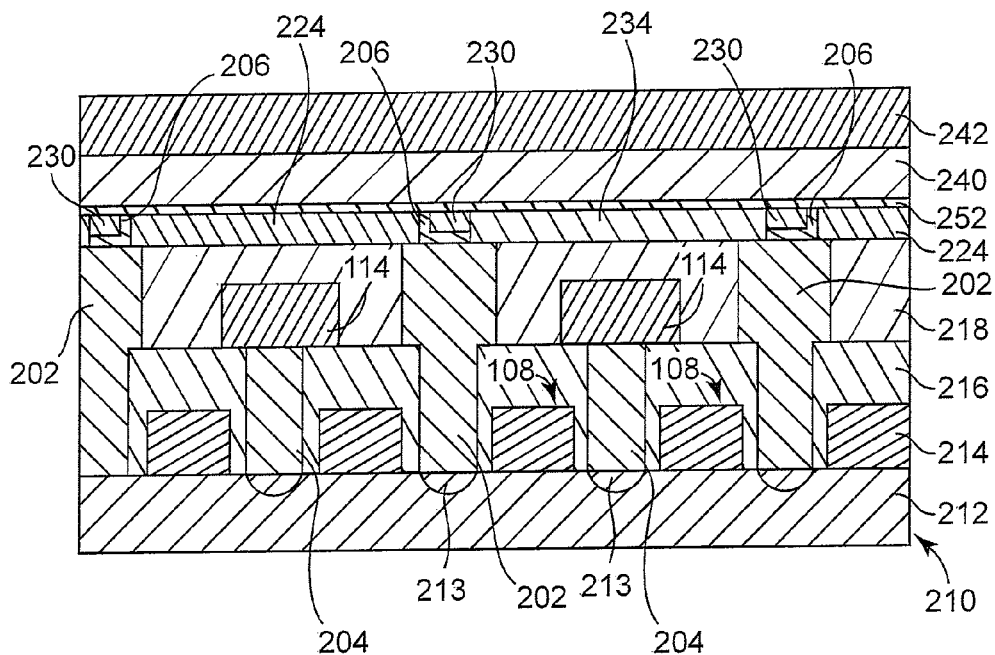
FIG. 15 illustrates a cross-sectional view of one embodiment of the preprocessed wafer, the first dielectric material layer, the bottom electrodes, the spacers, the third dielectric material layer, an etch stop material layer, phase change material, and top electrodes.

FIG. 15 illustrates a cross-sectional view of one embodiment of preprocessed wafer 210, first dielectric material layer 224, bottom electrodes 206, spacers 230, third dielectric material layer 234, an optional etch stop material layer 252, phase change material 240, and top electrodes 242. This embodiment is similar to the embodiment previously described and illustrated with reference to FIGS. 13A and 13B except that this embodiment includes optional etch stop material layer 252. In this embodiment, the etching of the trenches in the fifth dielectric material layer stops on the etch stop material layer. The exposed portions of the etch stop material layer are then etched to expose portions of bottom electrodes 206, spacers 230, first dielectric material layer 224, and third dielectric material layer 234 and to provide etch stop material layer 252.

Figure 16:
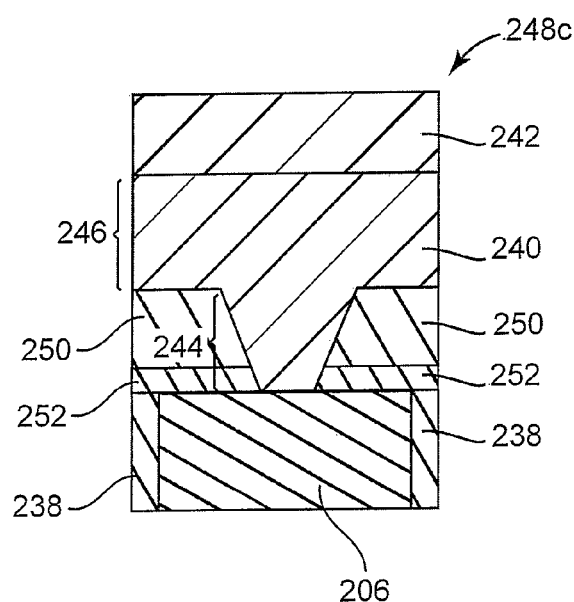
FIG. 16 illustrates a cross-sectional view of another embodiment of a phase change element.

FIG. 16 illustrates a cross-sectional view of another embodiment of a phase change element 248c for the embodiment including etch stop material layer 252. In one embodiment, each phase change element 106 is similar to phase change element 248c. Phase change element 248c includes a bottom electrode 206, etch stop material layer 252, phase change material 240, fourth dielectric material layer 238, fifth dielectric material layer 250, and top electrode 242. In this embodiment, first portion 244 of phase change material 240 is tapered due to a tapered trench etch. In another embodiment, first portion 244 of phase change material 240 is formed using a spacer process as previously described and illustrated with reference to FIG. 14A.

The following FIGS. 17-26 illustrate another embodiment for fabricating phase change elements that can be used in place of phase change elements 248a-248c previously described and illustrated with reference to FIGS. 14A, 14B, and 16.

Figure 17:
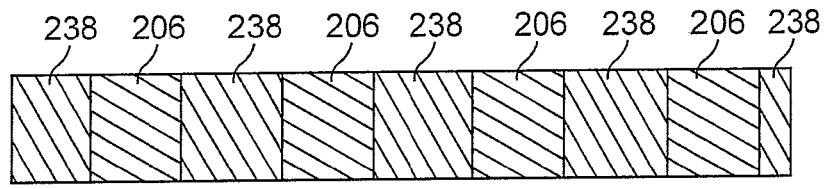
FIG. 17 illustrates a cross-sectional view of one embodiment of the bottom electrodes and the fourth dielectric material layer.

FIG. 17 illustrates a cross-sectional view of one embodiment of bottom electrodes 206 and fourth dielectric material layer 238 as previously described and illustrated with reference to FIGS. 13A and 13B.

Figure 18:
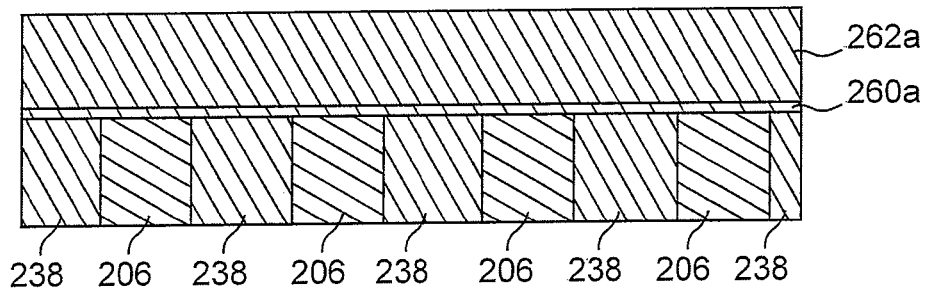
FIG. 18 illustrates a cross-sectional view of one embodiment of the bottom electrodes, the fourth dielectric material layer, an etch stop material layer, and a fifth dielectric material layer.

FIG. 18 illustrates a cross-sectional view of one embodiment of bottom electrodes 206, fourth dielectric material layer 238, an etch stop material layer 260a, and a fifth dielectric material layer 262a. An etch stop material, such as SiN or another suitable etch stop material is deposited over fourth dielectric material layer 238 and bottom electrodes 206 to provide etch stop material layer 260a. Etch stop material layer 260a is deposited using CVD, HDP-CVD, ALD, MOCVD, PVD, JVD, or other suitable deposition technique.

Dielectric material, such as $SiO_2$, $SiO_x$, SiN, FSG, BPSG, BSG, or other suitable dielectric material is deposited over etch stop material layer 260a to provide fifth dielectric material layer 262a. Fifth dielectric material layer 262a is deposited using CVD, HDP-CVD, ALD, MOCVD, PVD, JVD, or other suitable deposition technique.

Figure 19:
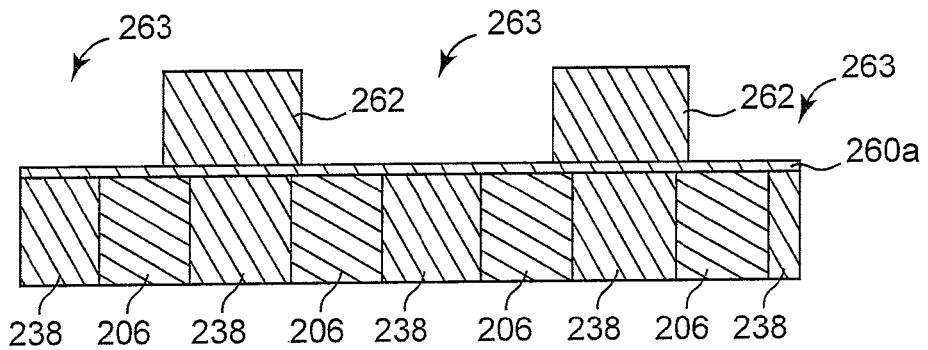
FIG. 19 illustrates a cross-sectional view of one embodiment of the bottom electrodes, the fourth dielectric material layer, the etch stop material layer, and the fifth dielectric material layer after etching the fifth dielectric material layer.

FIG. 19 illustrates a cross-sectional view of one embodiment of bottom electrodes 206, fourth dielectric material layer 238, etch stop material layer 260a, and fifth dielectric material layer 262 after etching fifth dielectric material layer 262a. Fifth dielectric material layer 262a is etched to provide openings 263 exposing portions of etch stop material layer 260a and to provide fifth dielectric material layer 262. In one embodiment, openings 263 are trenches.

Figure 20:
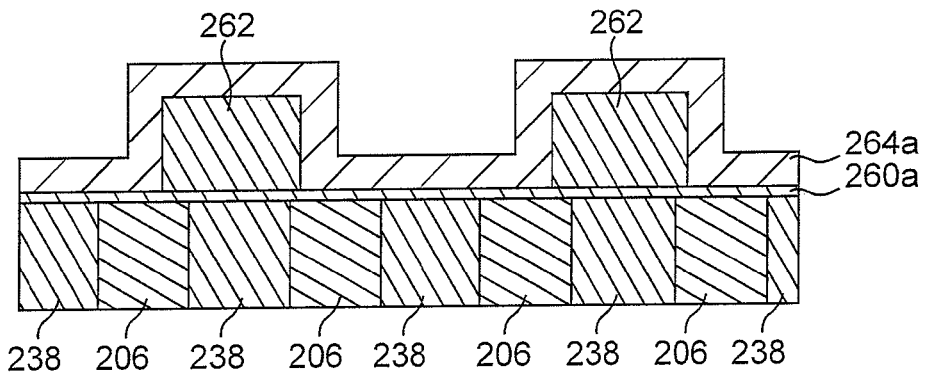
FIG. 20 illustrates a cross-sectional view of one embodiment of the bottom electrodes, the fourth dielectric material layer, the etch stop material layer, the fifth dielectric material layer, and a spacer material layer.

FIG. 20 illustrates a cross-sectional view of one embodiment of bottom electrodes 206, fourth dielectric material layer 238, etch stop material layer 260a, fifth dielectric material layer 262, and a spacer material layer 264a. A spacer material, such as poly-Si or another suitable spacer material is conformally deposited over exposed portions of fifth dielectric material layer 262 and etch stop material layer 260a to provide spacer material layer 264a. Spacer material layer 264a is deposited using CVD, HDP-CVD, ALD, MOCVD, PVD, JVD, or other suitable deposition technique.

Figure 21:
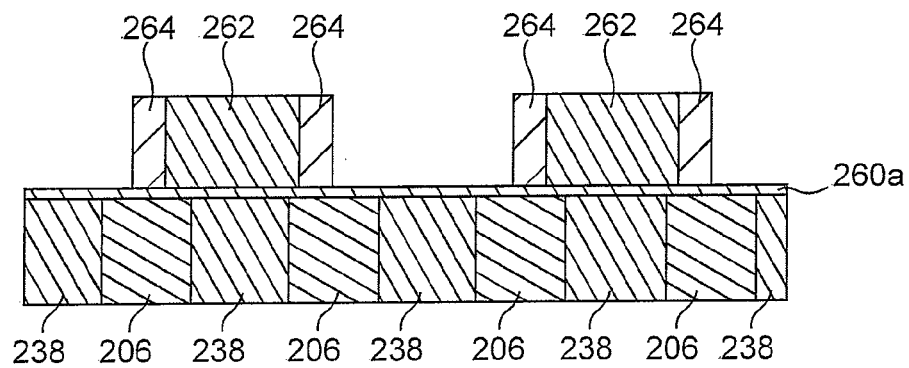
FIG. 21 illustrates a cross-sectional view of one embodiment of the bottom electrodes, the fourth dielectric material layer, the etch stop material layer, the fifth dielectric material layer, and spacers after etching the spacer material layer.

FIG. 21 illustrates a cross-sectional view of one embodiment of bottom electrodes 206, fourth dielectric material layer 238, etch stop material layer 260a, fifth dielectric material layer 262, and spacers 264 after etching spacer material layer 264a. Spacer material layer 264a is spacer etched to expose fifth dielectric material layer 262 and portions of etch stop material layer 260a and to provide spacers 264. Spacers 264 are above bottom electrodes 206.

Figure 22:
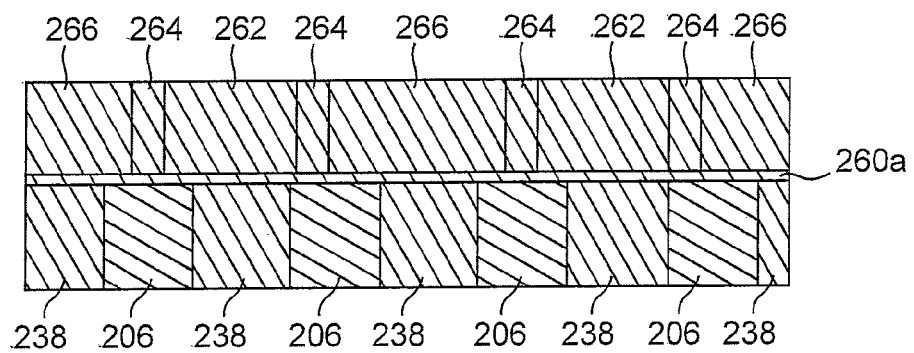
FIG. 22 illustrates a cross-sectional view of one embodiment of the bottom electrodes, the fourth dielectric material layer, the etch stop material layer, the fifth dielectric material layer, the spacers, and a sixth dielectric material layer.

FIG. 22 illustrates a cross-sectional view of one embodiment of bottom electrodes 206, fourth dielectric material layer 238, etch stop material layer 260a, fifth dielectric material layer 262, spacers 264, and a sixth dielectric material layer 266. Dielectric material, such as $SiO_2$, $SiO_X$, SiN, FSG, BPSG, BSG, or other suitable dielectric material is deposited over exposed portions of etch stop material layer 260a, fifth dielectric material layer 262, and spacers 264 to provide a sixth dielectric material layer. The sixth dielectric material layer is deposited using CVD, HDP-CVD, ALD, MOCVD, PVD, JVD, or other suitable deposition technique. The sixth dielectric material layer is then planarized using CMP or another suitable planarization technique to expose spacers 264 and fifth dielectric material layer 262 and to provide sixth dielectric material layer 266.

Figure 23:
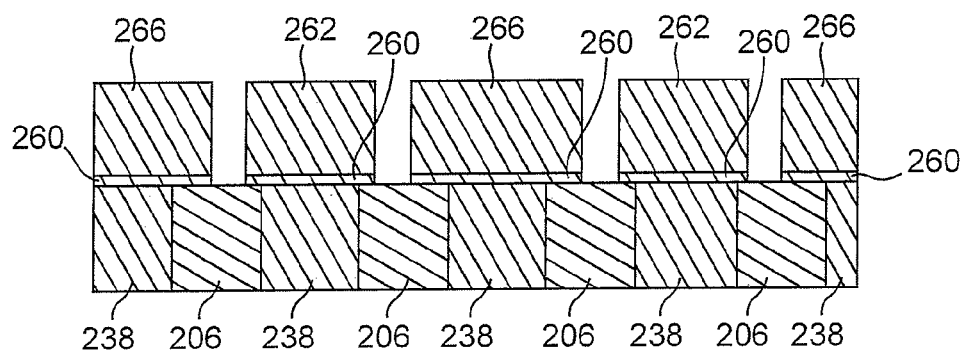
FIG. 23 illustrates a cross-sectional view of one embodiment of the bottom electrodes, the fourth dielectric material layer, the etch stop material layer, the fifth dielectric material layer, and the sixth dielectric material layer after removing the spacers and etching the etch stop material layer.

FIG. 23 illustrates a cross-sectional view of one embodiment of bottom electrodes 206, fourth dielectric material layer 238, etch stop material layer 260, fifth dielectric material layer 262, and sixth dielectric material layer 266 after removing spacers 264 and etching etch stop material layer 260a. Spacers 264 are removed using a selective etch or another suitable etch to expose portions of etch stop material layer 260a. The exposed portions of etch stop material layer 260a are etched to expose portions of bottom electrodes 206 and to provide etch stop material layer 260. In one embodiment, the exposed portions of bottom electrodes 206 have sublithographic cross-sections.

Figure 24:
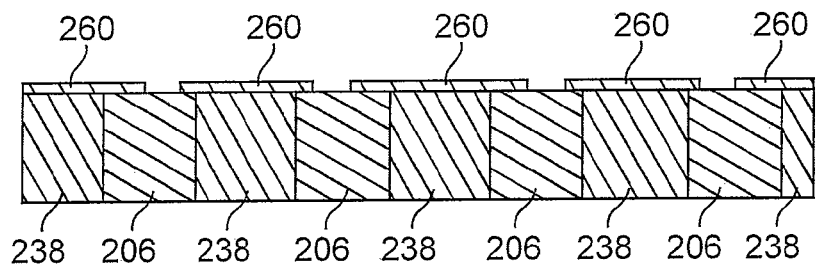
FIG. 24 illustrates a cross-sectional view of one embodiment of the bottom electrodes, the fourth dielectric material layer, and the etch stop material layer the after removing the fifth dielectric material layer and the sixth dielectric material layer.

FIG. 24 illustrates a cross-sectional view of one embodiment of bottom electrodes 206, fourth dielectric material layer 238, and etch stop material layer 260 the after removing fifth dielectric material layer 262 and sixth dielectric material layer 266. Fifth dielectric material layer 262 and sixth dielectric material layer 266 are removed to expose etch stop material layer 260.

Figure 25:
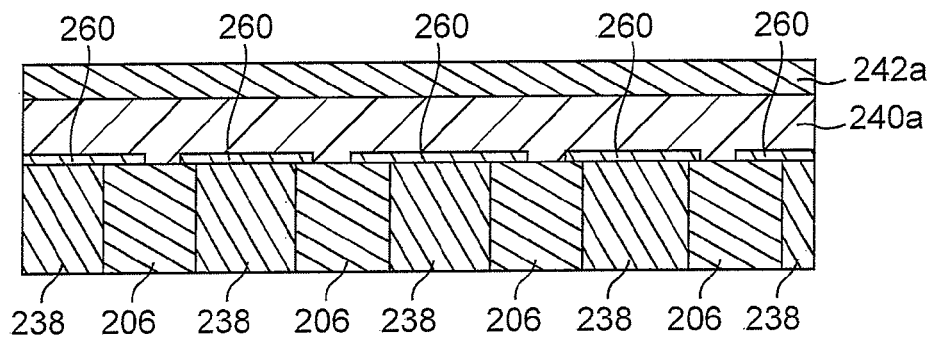
FIG. 25 illustrates a cross-sectional view of one embodiment of the bottom electrodes, the fourth dielectric material layer, the etch stop material layer, a phase change material layer, and an electrode material layer.

FIG. 25 illustrates a cross-sectional view of one embodiment of bottom electrodes 206, fourth dielectric material layer 238, etch stop material layer 260, a phase change material layer 240a, and an electrode material layer 242a. A phase change material, such as a chalcogenide compound material or other suitable phase change material is deposited over etch stop material layer 260 and exposed portions of the bottom electrodes 206 to provide a phase change material layer 240a. Phase change material layer 240a is deposited using CVD, HDP-CVD, ALD, MOCVD, PVD, JVD, or other suitable deposition technique. In another embodiment, a damascene process is used to provide the phase change material contacting bottom electrodes 206.

An electrode material, such as TiN, TaN, W, Al, Ti, Ta, TiSiN, TaSiN, TiAlN, TaAlN, WN, C, or other suitable electrode material is deposited over phase change material layer 240a to provide electrode material layer 242a. Electrode material layer 242a is deposited using CVD, ALD, MOCVD, PVD, JVD, or other suitable deposition technique.

Figure 26:
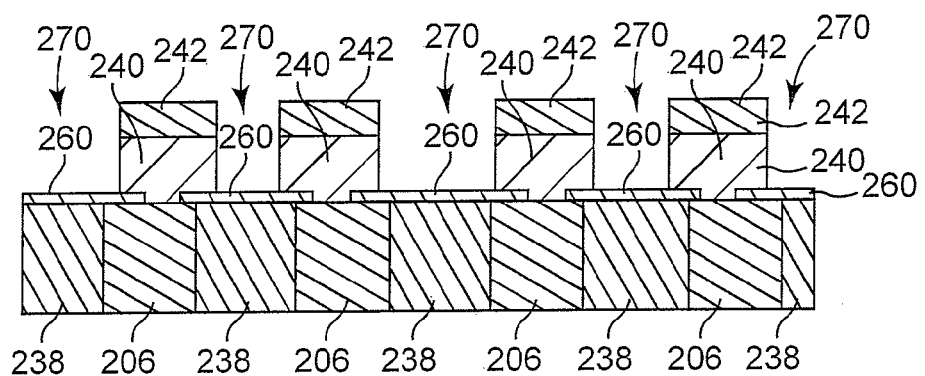
FIG. 26 illustrates a cross-sectional view of one embodiment of the bottom electrodes, the fourth dielectric material layer, the etch stop material layer, phase change material, and top electrodes after etching the phase change material layer and the electrode material layer.

FIG. 26 illustrates a cross-sectional view of one embodiment of bottom electrodes 206, fourth dielectric material layer 238, etch stop material layer 260, phase change material 240, and top electrodes 242 after etching phase change material layer 240a and electrode material layer 242a. Electrode material layer 242a and phase change material layer 240a are etched using RIE or another suitable etching technique to provide openings 270 exposing portions of etch stop material layer 260 and to provide phase change material 240 and top electrodes 242. In one embodiment, openings 270 are trenches. A phase change element is provided at the interface between each bottom electrode 206 and phase change material 240. Dielectric material is then deposited and planarized as previously described and illustrated with reference to FIG. 14A to provide dielectric material 252 in openings 270.

The following FIGS. 27A-29B illustrate another embodiment for fabricating a memory array, such as memory array 101 previously described and illustrated with reference to FIGS. 2 and 3. In this embodiment, the fabrication process previously described and illustrated with reference to FIGS. 4-11B is first performed.

Figure 27A:
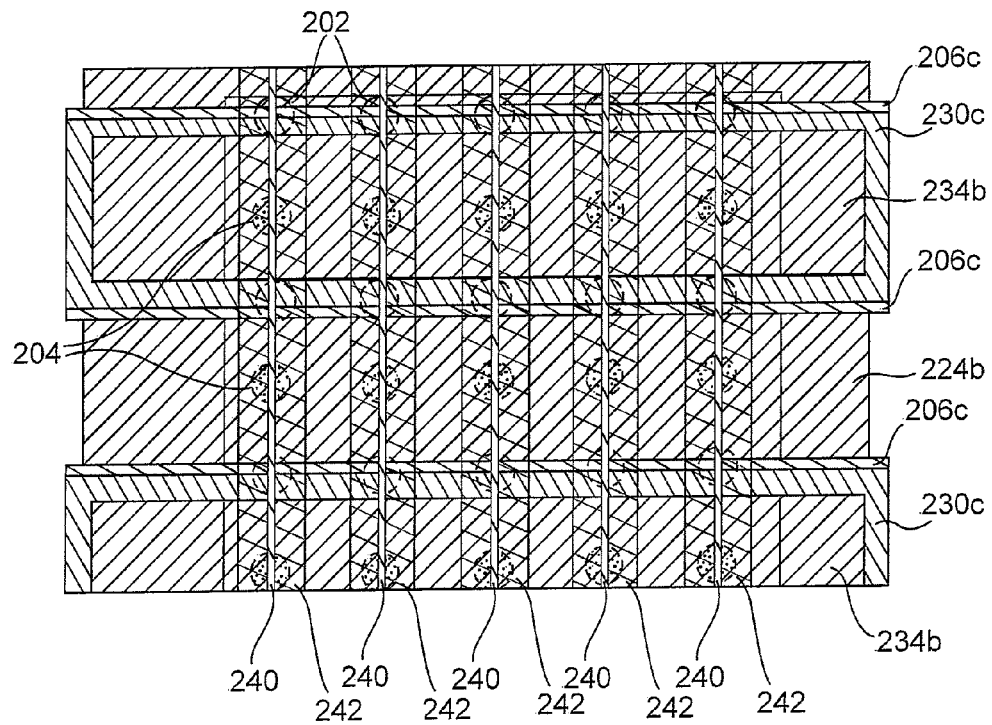
FIG. 27A illustrates a top view of one embodiment of the preprocessed wafer, the first dielectric material layer, the electrode material layer, the spacers, the third dielectric material layer, phase change material, and top electrodes.
Figure 27B:
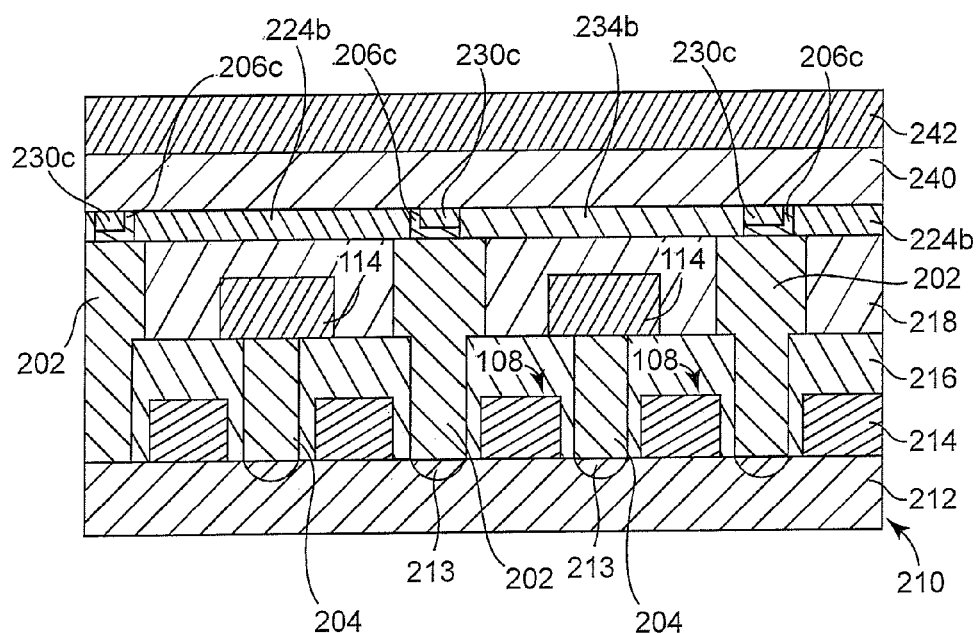
FIG. 27B illustrates a cross-sectional view of one embodiment of the preprocessed wafer, the first dielectric material layer, the electrode material layer, the spacers, the third dielectric material layer, phase change material, and top electrodes.

FIG. 27A illustrates a top view and FIG. 27B illustrates a cross-sectional view of one embodiment of preprocessed wafer 210, first dielectric material layer 224b, electrode material layer 206c, spacers 230c, third dielectric material layer 234b, phase change material 240, and top electrodes 242. In this embodiment, phase change material 240 and top electrodes 242 are fabricated as previously described and illustrated with reference to FIGS. 13A-16 before electrode material layer 206c is etched to provide bottom electrodes 206. In another embodiment, top electrodes 242 are fabricated following the processing steps described with reference to FIGS. 28-29B below.

Figure 28:
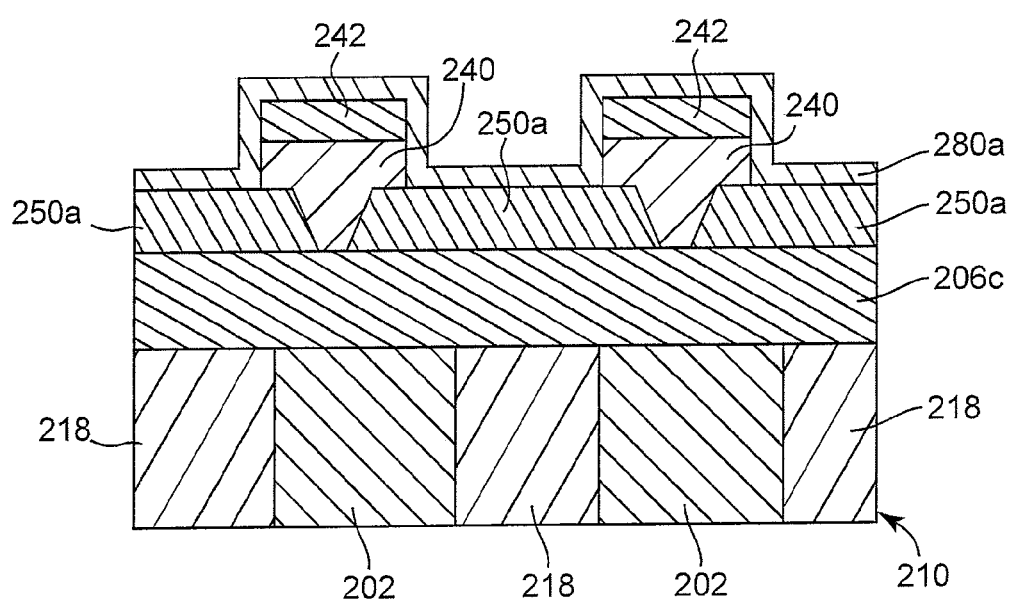
FIG. 28 illustrates a cross-sectional view of one embodiment of the preprocessed wafer, the electrode material layer, the third dielectric material layer, phase change material, top electrodes, and a spacer material layer.

FIG. 28 illustrates a cross-sectional view of one embodiment of preprocessed wafer 210, electrode material layer 206c, fifth dielectric material layer 250a, phase change material 240, top electrodes 242, and a spacer material layer 280a. The cross-sectional view illustrated in FIG. 28 is perpendicular to the cross-sectional view illustrated in FIG. 27B. A spacer material, such as SiN or another suitable spacer material is conformally deposited over exposed portions of top electrodes 242, phase change material 240, and fifth dielectric material layer 250a to provide spacer material layer 280a. Spacer material layer 280a is deposited using CVD, HDP-CVD, ALD, MOCVD, PVD, JVD, or other suitable deposition technique.

Figure 29A:
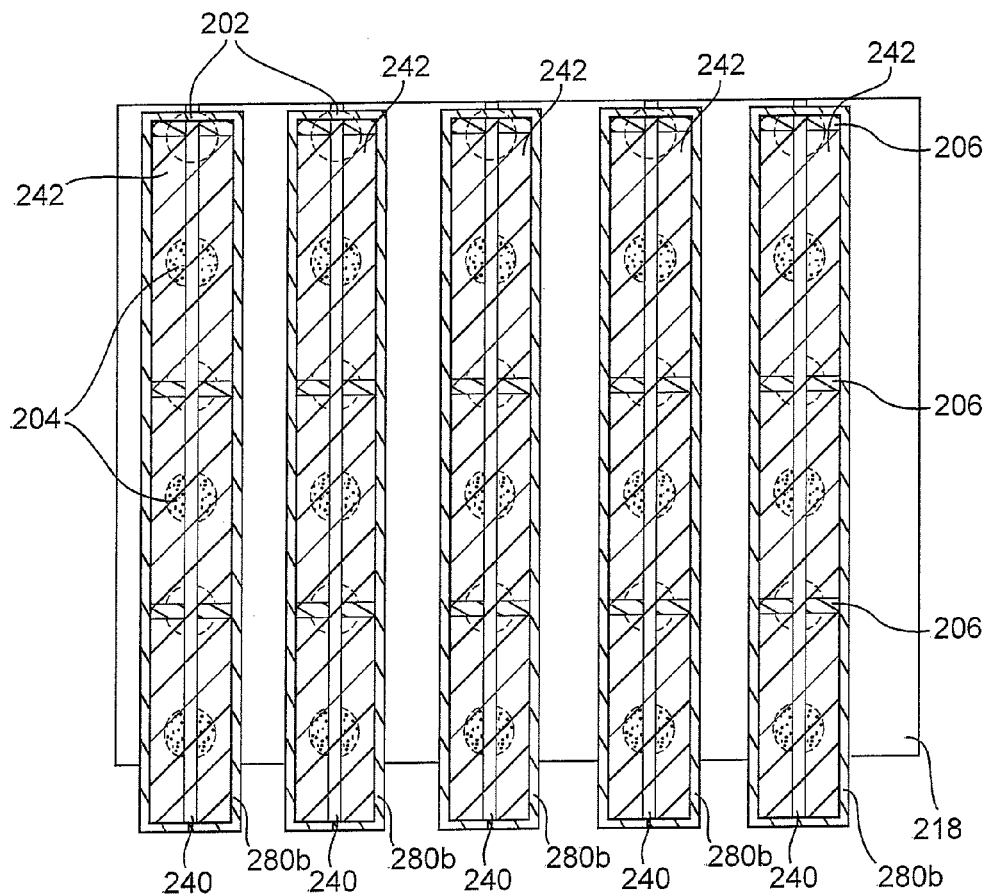
FIG. 29A illustrates a top view of one embodiment of the preprocessed wafer, bottom electrodes, the third dielectric material layer, phase change material, top electrodes, and spacers after etching.
Figure 29B:
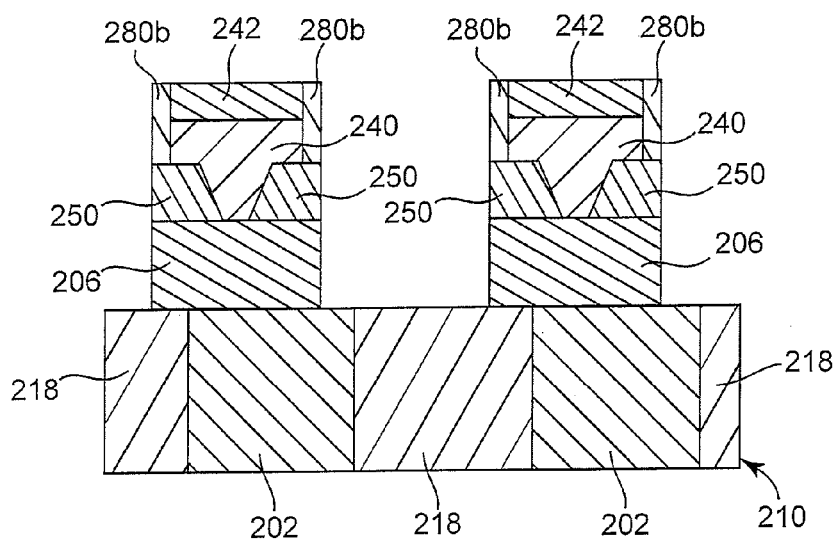
FIG. 29B illustrates a cross-sectional view of one embodiment of the preprocessed wafer, bottom electrodes, the third dielectric material layer, phase change material, top electrodes, and spacers after etching.

FIG. 29A illustrates a top view and FIG. 29B illustrates a cross-sectional view of one embodiment of preprocessed wafer 210, bottom electrodes 206, fifth dielectric material layer 250, phase change material 240, top electrodes 242, and spacers 280b after etching spacer material layer 280a, fifth dielectric material layer 250a, and electrode material layer 206c. Spacer material layer 280a is spacer etched using RIE or another suitable etching technique to expose top electrodes 242 and portions of fifth dielectric material layer 250a and to provide spacers 280b.

Fifth dielectric material layer 250a and electrode material layer 206c are then etched using RIE or another suitable etching technique self-aligned to spacers 280b to expose portions of preprocessed wafer 210 and to provide bottom electrodes 206 and fifth dielectric material layer 250. Dielectric material, such as $SiO_2$, $SiO_X$, SiN, FSG, BPSG, BSG, or other suitable dielectric material is deposited over exposed portions of top electrodes 242, spacers 280b, fifth dielectric material layer 250, bottom electrodes 206, and preprocessed wafer 210 to provide a dielectric material layer. The dielectric material layer is deposited using CVD, HDP-CVD, ALD, MOCVD, PVD, JVD, or other suitable deposition technique. The dielectric material layer is then planarized using CMP or another suitable planarization technique. Upper metallization layers including bit lines 112 and are then fabricated over top electrodes 242 to provide memory array 101.

Embodiments provide a phase change memory array including L-shaped bottom electrodes defined by sidewall deposition and a dielectric spacer. The bottom electrode fabrication process avoids tight overlay tolerances and includes self-aligned isolation patterning using the dielectric spacer to reduce the number of critical lithography steps used to fabricate the memory array.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a contact;
   a first spacer comprising a first sidewall and a second sidewall opposite the first sidewall;
   a first electrode including a first portion and a second portion, the first portion contacting the first sidewall of the first spacer, the second portion contacting the contact and defined by the first spacer such that the second portion comprises a sidewall aligned with the second sidewall of the first-spacer;
   a second electrode; and
   resistivity changing material between the second electrode and the first portion of the first electrode.

2. The integrated circuit of claim 1, wherein the first portion of the first electrode is sidewall defined and has a sublithographic cross-section.

3. The integrated circuit of claim 1, wherein the resistivity changing material comprises a first portion having a sublithographic cross-section contacting the first portion of the first electrode.

4. The integrated circuit of claim 3, wherein the first portion of the resistivity changing material is defined by second spacers.

5. The integrated circuit of claim 3, wherein the first portion of the resistivity changing material is defined by a tapered trench.

6. The integrated circuit of claim 3, wherein the first portion of the resistivity changing material is defined by a sacrificial spacer defined trench.

7. The integrated circuit of claim 1, wherein the resistivity changing material comprises phase change material.

8. A system comprising:
   a host; and
   a memory device communicatively coupled to the host, the memory device comprising:
   a first spacer comprising a first sidewall and a second sidewall opposite the first sidewall;
   a first electrode including a first portion and a second portion, the first portion contacting the first sidewall of the first spacer, the second portion defined by the first spacer such that the second portion comprises a sidewall aligned with the second sidewall of the first spacer;
   a second electrode; and
   a phase change element between the first electrode and the second electrode.

9. The system of claim 8, wherein the first portion of the first electrode is sidewall defined and has a sublithographic cross-section.

10. The system of claim 9, wherein the phase change element comprises a first portion having a sublithographic cross-section contacting the first portion of the first electrode.

11. The system of claim 10, wherein the memory device further comprises:
    an access device coupled to the first electrode.

12. The system of claim 8, wherein the memory device further comprises:
    a write circuit configured to program the phase change element;
    a sense circuit configured to read a state of the phase change element; and
    a controller configured to control the write circuit and the sense circuit.

13. A memory comprising:
    a first electrode consisting of a first portion and a second portion forming an L-shaped first electrode;
    means for defining a size of the second portion of the first electrode;
    a second electrode; and
    means for confining current between the first electrode and the second electrode.

14. The memory of claim 13, wherein the means for confining current is defined by spacers on sidewalk of a trench.

15. The memory of claim 13, wherein the means for confining current is defined by a tapered trench.

16. The memory of claim 13, wherein the means for confining current is defined by a sacrificial spacer defined trench.

17. The memory of claim 13, wherein the means for confining current is defined by damascene patterning of resistivity changing material.

18. An integrated circuit comprising:
    a memory array including rows and columns, the memory array comprising:
    a plurality of first electrodes, each first electrode comprising a strip of electrode material formed by etching a line of electrode material along each row;
    a plurality of lines of phase change material, each line of phase change material along a column and contacting at least two first electrodes along the column; and
    a plurality of lines of electrode material, each line of electrode material along a column and contacting the line of phase change material along the column.

19. An integrated circuit comprising:
    a contact;
    a first spacer;
    a first electrode consisting of a first portion and a second portion forming an L-shaped first electrode, the second portion contacting the contact and defined by the first spacer;
    a second electrode; and
    resistivity changing material between the second electrode and the first portion of the first electrode.

20. The integrated circuit of claim 19, wherein the first portion of the first electrode is sidewall defined and has a sublithographic cross-section.

21. The integrated circuit of claim 19, wherein the resistivity changing material comprises a first portion having a sublithographic cross-section contacting the first portion of the first electrode.

22. The integrated circuit of claim 21, wherein the first portion of the resistivity changing material is defined by second spacers.

23. The integrated circuit of claim 21, wherein the first portion of the resistivity changing material is defined by a tapered trench.

24. The integrated circuit of claim 21, wherein the first portion of the resistivity changing material is defined by a sacrificial spacer defined trench.

25. The integrated circuit of claim 19, wherein the resistivity changing material comprises phase change material.

26. A system comprising:

a host; and a memory device communicatively coupled to the host, the memory device comprising:

a first spacer;

a first electrode consisting of a first portion and a second portion forming an L-shaped first electrode, the second portion defined by the first spacer;

a second electrode; and a phase change element between the first electrode and the second electrode.

27. The system of claim 26, wherein the first portion of the first electrode is sidewall defined and has a sublithographic cross-section.

* * * * *